United States Patent [19]

Potter et al.

[11] Patent Number: 4,808,912

[45] Date of Patent: Feb. 28, 1989

[54] SIX-PORT REFLECTOMETER TEST ARRANGEMENT AND METHOD INCLUDING CALIBRATION

[75] Inventors: Christopher M. Potter, Stevenage; George Hjipieris, Hitchin, both of United Kingdom

[73] Assignee: Marconi Instruments Limited, St. Albans, United Kingdom

[21] Appl. No.: 948,055

[22] Filed: Dec. 31, 1986

[30] Foreign Application Priority Data

Jan. 17, 1986 [GB] United Kingdom ................. 8601108
Apr. 16, 1986 [GB] United Kingdom ................. 8609227

[51] Int. Cl.4 ............................................ G01N 22/00
[52] U.S. Cl. ................................ 324/58 B; 324/58 R
[58] Field of Search .............. 324/58 B, 58.5 B, 58 R, 324/58.5 R, 58 A, 58.5 A

[56] References Cited

PUBLICATIONS

Hoer, Performance of a Dual Six-Port Automatic Network Analyzer, IEEE Transactions Microwave Theory and Techniques, vol. MTT-27, No. 12 Dec. 1979, pp. 993-998.
"A Network Analyzer Incorporating Two Six-Port Reflectometers," C. A. Hoer, IEEE Transactions on Microwave Theory & Techniques, vol. MTT-25, No. 12, Dec. 1977, pp. 1070-1074.
"A Six-Port Automatic Network Analyzer," Cronson, IEEE Transaction on Microwave Theory & Technique, vol. MTT-25, No. 12, Dec. 1977 pp. 108 6-1091.
"An Improved Circuit for Implementing the Six-Port Technique of Microwave Measurements," Egen, IEEE Transactions on Microwave Theory & Techniques, vol. MTT-25, No. 12, Dec. 1977, pp. 1080-1083.
"Using Six-Port and Eight-Port Junctions to Measure Active and Passive Circuit Parameters," C. A. Hoer, NBS Tech. Note 673, 9/75.
"Calibrating the Six-Port Reflectometer by means of Sliding Terminations," G. F. Engen, IEEE Transactions on Microwave Theory and Techniques, vol. MTT-26, No. 12, Dec. 1978, pp. 951-957.

Primary Examiner—Reinhard J. Eisenzopf
Assistant Examiner—Jack B. Harvey
Attorney, Agent, or Firm—Spencer & Frank

[57] ABSTRACT

A test arrangement for testing high frequency electrical devices consisting of two 6-port reflectometers which are both connected to a device under test. In order to calibrate the test arrangement, an arbitrary termination generator is connected to each test port while its test signal represents a reflectivity coefficient of greater than unity, so that it simulates active devices as well as passive ones.

9 Claims, 4 Drawing Sheets

SIX-PORT REFLECTOMETER TEST ARRANGEMENT AND METHOD INCLUDING CALIBRATION

BACKGROUND OF THE INVENTION

This invention relates to a test arrangement which is suitable for performing electrical measurements on high frequency electrical devices. The invention is intended for operation in the radio frequency or microwave frequency range.

One of the most powerful techniques used to characterise radio frequency (R.F.) and microwave components is the Scattering Parameter (or S-Parameter) model. The R.F. device is treated as a "black box" with various input and output terminals. Each pair of terminals is termed a "port". The device's performance is quantified by applying a wave to one port and recording the emergent waves at each port caused by that wave. The relationships between the waves are expressed in a matrix of complex coefficients, called the S-parameter matrix.

These complex coefficients can be measured by means of a network analyser which separates out the required waves and evaluates their complex relationship. Automatic network analysers have been developed in which the frequency of a variable frequency oscillator is controlled over a particular frequency band. These analysers are very complex involving directional couplers or bridges to sample the incident and reflected waves. The samples are then ratioed to find the magnitude and phase of the reflection coefficient. This is a complicated step in practice, as phase angles cannot be directly measured at frequencies higher than about 500 kHz. Therefore, the system has to convert the RF samples down to a suitable frequency before measuring them. To do this while accurately maintaining their amplitude and phase relationships is both difficult and expensive. Mixers or samplers used in such a heterodyne system must be extremely linear.

An arrangement known as a Six-Port Network Analyser relies on the use of amplitude measurements, without the need to measure phase information, and is able to use relatively simple RF circuitry, providing that the Six-Port Network Analyser can be accurately calibrated. As previously known, such arrangements have severe operational drawbacks; they are slow and cumbersome to use, and are regarded primarily as laboratory instruments requiring the use of skilled operators. To fully characterise a two-port device under test (DUT) the use of a dual configuration of Six-Port Network Analysers is needed. In order to be able to use a Six-Port Network Analyser to perform accurate and repeatable measurements, it is first necessary to fully calibrate it so that the amplitude values which it produces can be precisely and unambiguously converted to the characterising parameters of a DUT. Such a calibration process can be time consuming and complex, requiring the use of skilled operators and expensive test equipment.

The present invention seeks to provide an improved test arrangement.

SUMMARY OF THE INVENTION

According to this invention a test arrangement includes a six-port network having a test port connectable to a device under test; a high frequency signal source which is coupled to the test port, to the six-port network, and to a termination generator; the termination generator including an alterable impedance so as to modify the high frequency signal; and means for directly coupling the modified high frequency signal to the test port to enable calibration of the test arrangement.

According to an important aspect of this invention the termination generator is capable of producing a modified high frequency signal which corresponds to a reflection coefficient of a device under test of greater than unity. A coefficient of greater than unity implies the simulation of an active device under test. This enables the conditions under which the test arrangement is calibrated to be optimised, so as to give convenient and accurate calibration values. Once calibrated, the test arrangement can be used to accurately test and measure a wide range of devices, and it is particularly suitable for use with microwave devices.

The termination generator can be used to achieve calibration of just a single six-port network, but for many purposes it is necessary to use two six-port networks to fully characterise a device under test. With two such networks there is clearly a larger number of calibration parameters to be determined.

In such an arrangement of two six-port networks having respective test ports connectable to a device under test, a common high frequency signal source is switchably connected to said test ports so as to apply said high frequency signal to one or other of said ports at will, and the high frequency is fed to both six-port networks simultaneously as a reference. The modified high frequency signal, which is modified by the termination generator, is applied to each of the test ports in turn. The termination generator includes a switchably alterable attenuator and a switchably alterable phase shifter. By altering the attenuator and phase shifter to produce a number of different calibration signals, the outputs of the two six-port networks can be made to represent a sufficiently large number of simultaneous equations, thereby enabling the various calibration factors to be calculated so as to fully characterise the test arrangement.

BRIEF DESCRIPTION OF THE DRAWINGS

The invention is further described by way of example with reference to the accompanying drawings, in which.

DESCRIPTION OF THE PREFERRED EMBODIMENTS

As mentioned previously, the invention utilises a pair of six-port networks. The term "six-port" originates from the classification of types of network analyser—it is an analyser which has six ports used for measuring one-port devices, by way of contrast with a network analyser of the conventional heterodyne type mentioned previously and which has four ports. These four ports are used for; i, the incident signal applied by an RF source to the device under test (DUT); ii, an output sample 'a' of the incident wave upon the DUT; iii, an output sample 'b' of the reflected wave from the DUT; and iv, the test port to which the device under test is connected. In a six-port reflectometer, the six ports are used for i, the incident signal applied by an RF source to the device under test; ii, the test port, iii, a port which samples mainly the signal 'a'; and ports iv, v and vi which sample different combinations of the signals 'a' and 'b', where 'a' and 'b' are as previously defined.

Figure 1:
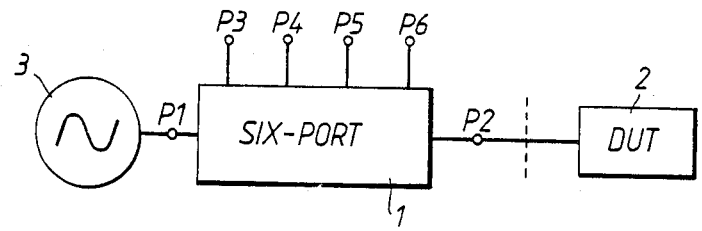
FIG. 1 is an explanatory diagram.

A simple system with a six-port network 1 connected to a device under test 2 (DUT) is shown in FIG. 1, in which an RF source 3 supplies the test signal.

It can be shown that the six-port equations for each port reduced to:

$$\Gamma = r + jx = \frac{\sum_{i=3}^{6}(F_i + jG) \cdot P_i}{\sum_{i=3}^{6} H_i P_i}$$

where Pi is the reading of a power meter connected to the 'i'th port, and port P3 samples the "a" vector only. The parameter $\Gamma$ is defined as being:

$$\Gamma = \frac{\text{reflected wave } (b)}{\text{incident wave } (a)}$$

The derivation of equations in this form is shown in the article by C.A. Hoer "Using Six-port and Eight-port Junctions to Measure Active and Passive Circuit Parameters" NBS Techn. Note 673.1975.

Calibration of the six-port reflectometer involves solving several simultaneous equations of the form given above. Different known DUTs are placed on the test-port, and the power meter readings are recorded from which the eleven unknown coefficients can be found.

It has been proposed by G.F. Engen, IEE Trans. MTT-26, No. 12 pp 951–957, Dec. 1978, to separate the calibrations of a six-port network into two stages. The first stage—the "Six-to-Four-port reduction"—establishes the internal constraints of the six-port. These account for five coefficients of the eleven, and arise because the "sixth port" must provide a consistent indication with the others, although it was only introduced to resolve a solution choice which would otherwise result in an ambiguity. This stage can be carried out by observing the power meter measurements for a number of unknown terminations. The second stage of the calibration is identical to that used to calibrate a four-port reflectometer of the heterodyne network analyser type. This requires the use of three standards, and finds the remaining six coefficients.

Figure 2:
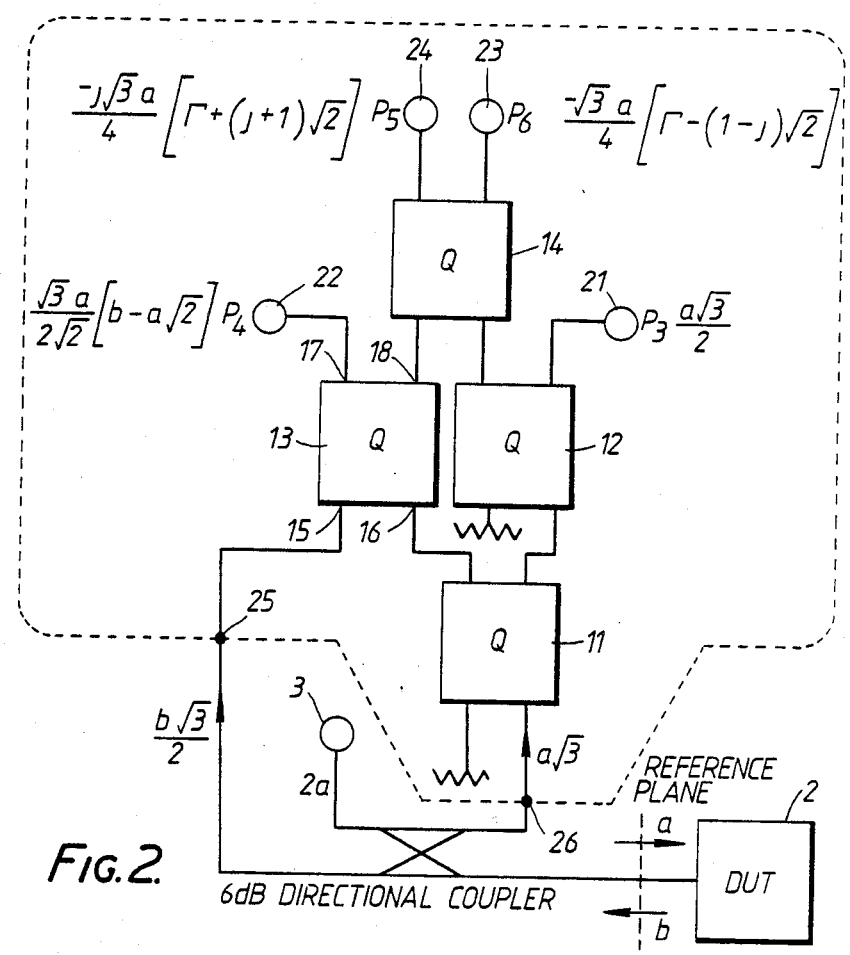
FIG. 2 is a diagramatic representation of a 6-port network.

One example of a six-port network which gives a particularly good theoretical performance is that shown in FIG. 2, as it produces a useful choice of "a" and "b" wave combinations that emerge from ports P3 to P6. These combinations are such as to hold inherent uncertainties in the measurement system to a minimum. FIG. 2 shows a circuit configuration which utilises hybrid couplers which is capable in theory of giving an almost ideal performance. This configuration was proposed by G. F. Engen in "An improved circuit for implementing the six-port technique of microwave measurements", IEE Trans. MTT-25, No. 12, Dec. 77 pp 1080–1083.

In FIG. 2, the source 3 and the device-under-test (DUT) 2 are shown in addition to the six-port network which consists of four interconnected hybrid couplers 11, 12, 13, 14. Each hybrid coupler is a four port device having two input ports 15, 16 and two output ports 17, 18 and is constructed such that an input signal applied to input port 15 is split equally so that half of the input power emerges from each of ports 17 and 18 (neglecting any internal losses) and the signal at port 18 lags the signal at port 17 by 90°. This is represented diagramatically in the left top corner of FIG. 3. Conversely, the signal applied to input port 16 is split equally between the two output ports 17 and 18, but this time the signal on port 17 lags by 90° the signal at port 18. It is usual to assume that there is no net phase lag across the hybrid coupler, but in practice this will not be so but will cancel out in the configuration of interconnected hybrid couplers which is illustrated.

By each of the four output ports 21, 22, 23, 24 of the six-port network is shown the output signal value which results from the application to the two input ports 25, 26 of the indicated proportions of the reflected wave b and the incident wave a, it being noted that $\Gamma = b/a$. The conventional designation P1 to P6 of the six-port network is also shown on FIG. 2.

The use of the two six-port networks enables the magnitude and phase characteristics of the two-port DUT to be inferred from magnitude measurements alone. Previously the use of a dual six-port network analyser has incurred serious drawbacks. One drawback has already been mentioned, i.e. that the DUT must be such that its characteristics are independent of power applied to both input and output ports simultaneously. Another drawback is that the calibration procedure by which the S-parameters are determined involves the use of a switched phase shifter and switched attenuator to provide three or more different but repeatable relationships between the two waves at the two test ports (the ports to which the DUT is connected). Also for wideband operation many narrow band precision air-line standards are needed. Furthermore it is invariably necessary to provide narrowband isolators to prevent power circulating between the two six-port networks and through the DUT more than once.

Figure 3:
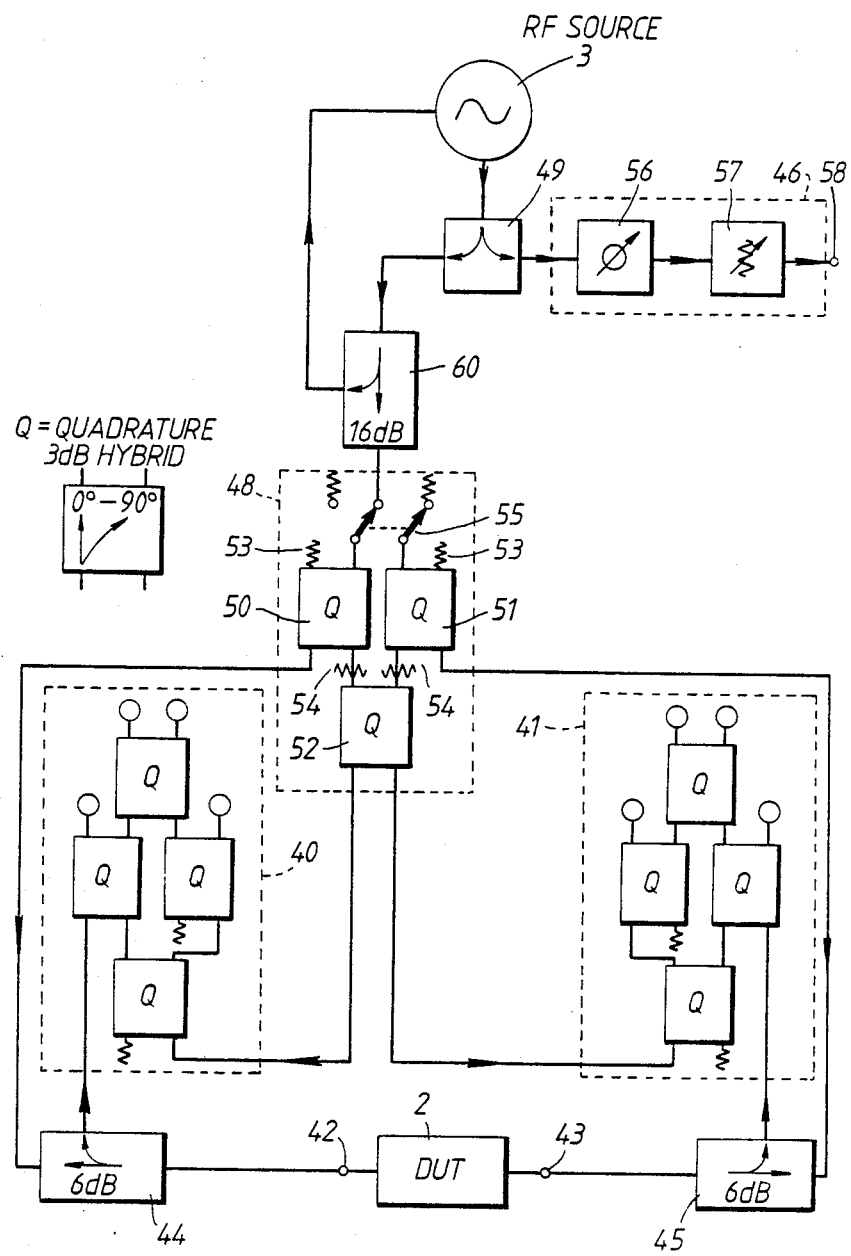
FIG. 3 shows an embodiment of the invention.

An embodiment of the present invention is shown in FIG. 3 which allows these drawbacks to be overcome and permits broadband operation as it does not require the use of narrowband components or standards.

Referring to FIG. 3, two six-port networks 40 and 41 are connected to two test ports 42 and 43 between which, in operation, the DUT 2 is connected. Each network 40 and 41 takes the form shown in FIG. 2, and two 6 dB directional couplers 44, 45 are connected as shown. These couplers 44, 45 are linked to the RF source 3, which generates the excitation signal at a required frequency, via a 16 dB directional coupler 60, a switching network 48 and a further power splitter 49 which form part of a termination generator 46, the latter being used to calibrate the networks 40 and 41. The small fraction of the incident power which is split off by the coupler 60 is routed back to the source 3 as a negative feedback signal to control the level of the output power of the source 3. A control circuit (not shown) is included in the feedback loop to compensate for the power variations that would occur as the frequency of the RF source is swept over a wide band.

The switching network 48 consists of three interconnected hybrid couplers 50, 51, 52, the fourth ports of couplers 50, 51, being terminated at matched loads 53 in the usual way, and a 3 dB attenuator 54 being interposed at each of the two input ports of coupler 52. The switching network 48 also includes a switch arrangement 55 which can connect either coupler 50 or coupler 51 to the RF source 3. The termination generator 46 has a variable phase shifter 56 and a variable attenuator 57 which are used to alter the phase and magnitude of the RF source signal which is fed to output port 58.

In operation, power from the RF source 3 is fed to the device under test either via the test -port 42 or via the test port 43, and the incident wave and the reflected waves are coupled via the couplers 44 and 45 to the six-port networks 40 and 41. The power emerging at the four output ports of the networks 40 and 41 is measured and the expressions (which are shown in FIG. 2) are calculated to determine the characteristics of the DUT 2.

The configuration of the switching network 48 is such that regardless of the switch position (and hence regardless of which test port 42 or 43 is receiving power from the RF source 3) both six-port networks 40 and 41 receive a sample of the RF power via coupler 52 so that both six-port networks operate simultaneously. The sample is taken off after the switching network 48 to minimise the effects of non-repeatability of the switch arrangement 55 and the effects of any non-repeatability can be ratioed out during calculation of the wanted parameters. The configuration of the switching network 48 allows DUT's which are active devices to operate into a matched load, so no problems are caused for amplifier measurement. It wil be noted that isolators are not required, so broadband operation is possible.

The two six-port networks are of the vector-voltmeter type; a vector-voltmeter finds the vector ratio of the two vector voltages. Each of the six-port networks has two inputs (corresponding to points 25 and 26 of FIG. 2), the signals at which are ratioed together. With the switch 55 in the forward position shown in FIG. 3, six-port network 40 measures the reflection wave of the DUT 2 at test port 42, and six-port network 41 measures the transmission of the DUT 2 at test port 43. When the switch 55 is moved to the reverse position, six-port network 41 measures reflection at test port 43, and six-port network 40 measures the transmission at test port 42. Hence all four of the Scattering parameters (S-parameters) can be measured individually, provided that the six-port networks are accurately calibrated.

To achieve correct calibration, the arbitrary termination generator 46 is used.

The six-port reflectometer shown in FIGS. 2 and 3 has the four detectors 21, 22, 23, 24 and their indications may be related to the reflection coefficient of the device under test (DUT) by the following equations:

$$\frac{P_2}{P_1} = e_2 \left| \frac{d_2\Gamma + 1}{c\Gamma + 1} \right|^2 \quad (1)$$

$$\frac{P_3}{P_1} = e_3 \left| \frac{d_3\Gamma + 1}{c\Gamma + 1} \right|^2$$

$$\frac{P_4}{P_1} = e_4 \left| \frac{d_4\Gamma + 1}{c\Gamma + 1} \right|^2$$

where $P_{1,2,3,4}$ are the power indications $c, d_{2,3,4}$ are complex constants dependent on the 6-port hardware $e_{2,3,4}$ are real constants dependent on the 6-port hardware $\Gamma$ is the reflection coefficient of the DUT.

Each complex constant consists of 2 real numbers and therefore a total of 11 real constants describe a 6-port circuit.

Once these real constants are known, then the reflection coefficient of a one-port device may be determined by observing the 4 detector responses. A geometrical interpretation of evaluating $\Gamma$ from the 4-detector responses is that of 3 circles intersecting at $\Gamma$.

Figure 4:
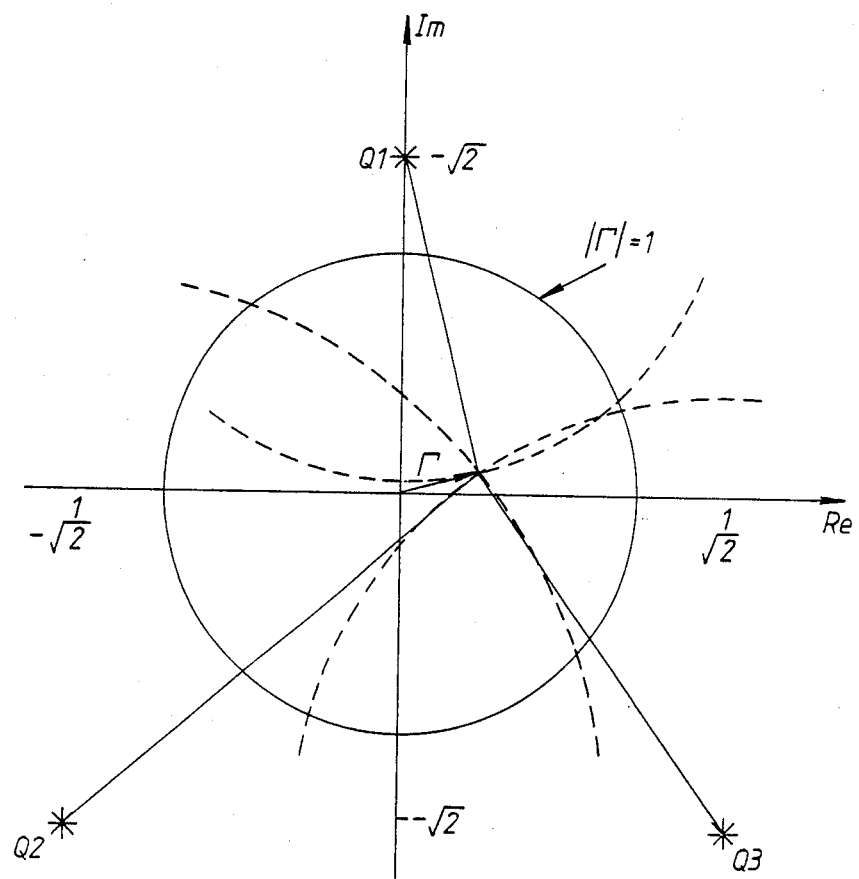
FIG. 4 is an explanatory diagram.

Such a geometrical representation is shown in FIG. 4, in which the centres of the three circles are Q1, Q2, Q3. The centres of these circles are chosen so that their point of intersections have fairly large angles, thereby allowing the position representing $\Gamma$ to be determined accurately.

The circle centres and their radii are functions of the observed responses and 6-port constants. Thus every point in the $\Gamma$-plane has a unique combination of detector responses associated with it and this is described by:

$$= \frac{(F_1 + jG_1)P_1 + (F_2 + jG_2)P_2 + (F_3 + jG_3)P_3 + (F_4 + jG_4)P_4}{P_1 + H_2P_2 + H_3P_3 + H_4P_4} \quad (2)$$

where the 11 real constants in (2) are functions of the 11 real constants in (1).

Calibration of a six-port circuit is the process of evaluating these 11 real constants for without these no measurements can be made. In general devices with known characteristics, in this case known $\Gamma$'s can be connected to the 6-port reflectometer and from the detector responses a set of linear or non-linear simultaneous equations can be formed and solved for the unknown constants.

Calibration of the dual six-port networks is carried out in two stages. In the first stage the six-port network is reduced to four-ports, that is to say the number of unknown coefficients is reduced to the number associated with a four-port network. In the circuit shown in FIG. 3, the reduction coefficients remain constant for a particular six-port network irrespective of whether it is being used to make reflection or transmission measurements.

In order to achieve the 6 to 4-port reduction, theory requires the connection of nine different loads to the test port. Conventionally, the loads could be realised by connecting a variable attenuator backed by a movable short circuit to the test port. Different combinations of attenuation and short circuit positions result in different loads. It should be noted that all these combinations result in passive loads, i.e. $|\Gamma| \leq 1$.

However, by using a combination of both active and passive loads a better conditioned reduction results. By this we mean that the iterative part of the 6-4 port reduction is less likely to diverge. This is to do with the relative positions of the loads in the $\Gamma$-plane to those of the impedance locating circle centers. The use of an active load allows a greater degree of positional flexibility of the arbitrary terminations in the $\Gamma$-plane, and this in turn leads to a set of data which is better conditioned for the reduction.

The arbitrary termination generator can perform as an active load because when connected to the test port more power can go into the test port than that coming out, i.e. $|\Gamma|>1$. The greatest $|\Gamma|$ it can produce depends on the circuit arrangement and component values. In practice values of up to $|\Gamma|\approx 3$ have been used successfully. It is the property of the arbitrary termination generator in being able to generate a value $\Gamma$ which is greater than unity, which makes its use so beneficial for calculating the dual six-port reflectometer's characteristics so as to fully calibrate it.

The heterodyne ANA (automatic network analyser) six-port networks have twelve error paths which are accounted for by calibration, but the circuit shown in FIG. 3 has extra leakage paths associated with the configuration of hybrids 50, 51, 52 used to feed reference samples of the RF source signal to the two six-port networks. These leakage paths are excited and quantified using the termination generator 46. The power splitter 49 divides the RF source power between the two six-port networks on the one hand, and the switchable phase shifter and switchable atenuator on the other hand.

With the switch 55 in its forward position, i.e. as shown in FIG. 3, the arbitrary termination generator 46 is connected to port 43, and for each standard impedance (i.e. open circuit, short or matched load circuit) connected to port 42, measurements are made using the detectors 21, 22, 23, 24 of both six port networks 40 and 41 with the arbitrary termination generator both off and energised in turn. The switch 55 is reversed, and similar measurements are made with the arbitrary termination generator 46 and inpedance standards having changed ports. Finally the two ports 42 and 43 are connected together and a third set of measurements are taken.

Termination generator 46 is used to achieve the six-to-four port reduction. The output 58 of the termination generator is connected to each test port 42 and 43 in turn during this reduction stage of the calibration process. Altering the attenuator 57 and the phase shifter 56 gives a wide range of terminations—both active and passive. This calibration configuration can be termed an Arbitrary Termination Generator, and is capable of producing both reflections and transmission. During the six-to-four port reduction stage, the termination generator 46 is arranged to provide several arbitrary reflections. Subsequently, during the second stage of the calibration (during which the "reduced" four port network is calibrated) it is used to provide several arbitrary transmissions.

Figure 5:
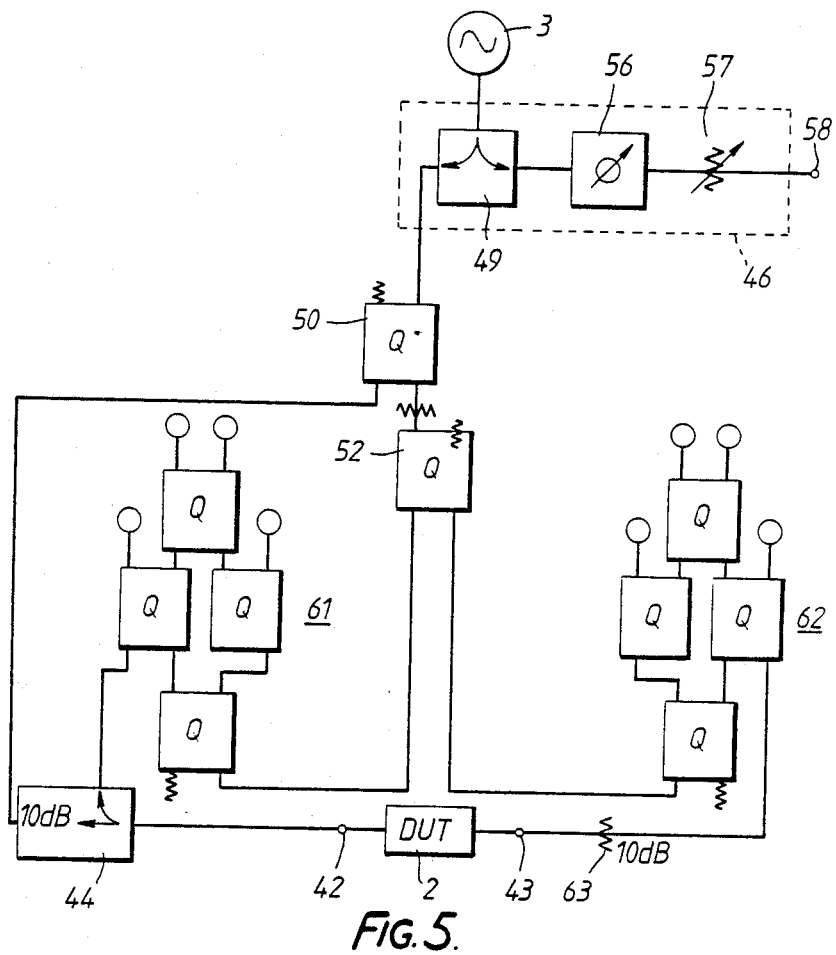
FIGS. 5 and 6 show further embodiments of the invention.

FIG. 5 shows an alternative "one-path" configuration for the dual six-port networks. In FIG. 5, one six-port network 61 is permanently used for measuring reflection, and the other six-port network 62 is used for measuring transmission. The attenuator 63 is used to balance the signal levels in a manner analogous to the attenuator 44, which has its counterpart in FIG. 3. The six-to-four port reduction is carried out as before using the termination generator 46, and the subsequent calibration of the "four-port" network is the same as for the forward mode of the arrangement shown in FIG. 3. Other items in FIG. 5 carry the same reference numerals as in FIG. 3 where they provide the same function.

The one-path network analyser test arrangement shown in FIG. 5 is less convenient to use than that shown in FIG. 3, because a user must continually reverse the DUT as the measurement proceeds. This configuration is, however, less expensive and somewhat fewer components are required, and it has the merit of improved accuracy as there are no switch losses or repeatability errors—this is an important consideration where the test arrangement is implemented in waveguide as the switches are predominantly mechanical, and hence not always adequately repeatable.

Figure 6:
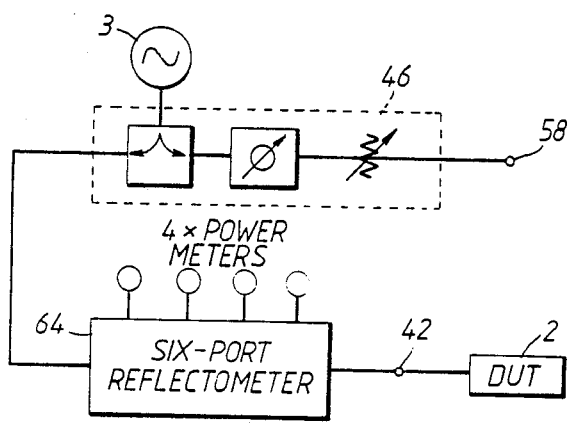

The termination generator can be incorporated into a simple reflectometer circuit as is shown in FIG. 6. The R.F. source 3, and the termination generator 46, correspond to those described in connection with FIG. 3, but the six-port reflectometer 64 is of the conventional kind in that only a single reflectometer is used in which it is not appropriate to feed to it a separate reference sample of the high frequency signal, as is done in FIGS. 3 and 5. In FIG. 6, the termination generator 46 is used only during the six-to-four port reduction stage of the calibration process.

We claim:

1. A test arrangement comprising
a six-port network having an input port;
a test port connectable to a device under test;
a high frequency signal source;
test signal path means connecting said signal source to the input port of said six-port network and to said test port;
a termination generator having an input coupled to said signal source by a calibration signal path different from said test signal path, and an output, said termination generator having means for selectively altering its impedance for modifying said high frequency signal, and
means for directly coupling the modified high frequency signal at the output of said termination generator to said test port, said modified high frequency signal simulating a device under test having a reflection coefficient which is selectably greater or less than unity thereby enabling calibration of said test arrangement.

2. An arrangement as claimed in claim 1 and wherein a predetermined proportion of the power of said high frequency signal is coupled to said termination generator.

3. An arrangement as claimed in claim 1 and wherein said termination generator includes an alterable phase attenuator.

4. An arrangement as claimed in claim 1 and wherein said termination generator includes an alterable phase shifter.

5. An arrangement as claimed in claim 1 which further includes a second six-port network and a second test port, and wherein said high frequency signal source is common to both six-port networks and is switchably connected to said first and second test ports so as to apply said high frequency signal to only one of said test ports at any one time, said high frequency signal being fed to both six-port networks simultaneously as a reference signal.

6. A method of calibrating a test arrangement which includes a six-port network, a test port connectable to a device under test and to said six-port network, a high frequency signal source, and a termination generator having a selectably alterable impedance for modifying said high frequency signal, said method including the steps of
connecting the output of said signal source to said said six-port network and to said said test port;
connecting the output of said termination generator to said test port;
applying the modified high frequency signal at the output of said termination generator directly to said test port;

altering the impedance of said termination generator to a plurality of different values, said modified high frequency signal simulating a device under test having a reflection coefficient which is selectably greater or less than unity;

measuring the power levels provided at the output ports of said six-port network for each of said impedance values; and calculating therefrom the characteristics of said test arrangement.

7. A method as claimed in claim 6 and wherein said plurality of different impedance values includes variations both in amplitude and in phase.

8. A method as claimed in claim 6 wherein said test arrangement includes a second six-port network and a second test port, said modified high frequency signal being applied to said first and second test ports in turn.

9. A method as claimed in claim 8 wherein while said modified high frequency signal is applied to one of said first and second test ports, a standard impedance comprising a short circuit or an open circuit is applied to the other of said test ports.

* * * * *